United States Patent
Kwon et al.

(12)

(10) Patent No.: US 6,338,909 B1
(45) Date of Patent: *Jan. 15, 2002

(54) LIGHT-EMITTING COMPOUND AND DISPLAY DEVICE ADOPTING LIGHT-EMITTING COMPOUND AS COLOR-DEVELOPING SUBSTANCE

(75) Inventors: Soon-ki Kwon, Chinju; Yun-hi Kim, Pusan; Dong-cheol Shin, Chinju; Han-sung Yu, Anyang; Seung-han Yoo, Suwon, all of (KR)

(73) Assignee: Samsung Display Devices Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/351,169

(22) Filed: Jul. 12, 1999

(30) Foreign Application Priority Data

Nov. 12, 1998 (KR) .......................................... 98-48403

(51) Int. Cl.⁷ .............................................. H05B 33/14
(52) U.S. Cl. ........................ 428/690; 428/704; 428/917; 313/504; 313/506; 257/40; 257/103; 252/301.16; 252/301.35

(58) Field of Search ................................. 428/690, 917, 428/704; 313/504, 506; 257/40, 103; 252/301.35, 301.16

(56) References Cited

PUBLICATIONS

"Development and Application of Electroluminescent Device", The Collection of Papers of the Macromolecular Chemical Symposium, vol. 11 (3) , 1998.

Ahn et al.; "EL polymer containing silicon 1,3,4–oxadiazole in main chain, and optical characteristics thereof", Abstracts, vol. 23, No. 2, Oct. 1998.

*Primary Examiner*—Cynthia H. Kelly
*Assistant Examiner*—Ling Xu
(74) *Attorney, Agent, or Firm*—Leydig, Voit, & Mayer, Ltd.

(57) ABSTRACT

A light-emitting compound and a display device adopting the light-emitting compound as a color-developing substance. The light-emitting compound, as a blue luminous material, is good in luminous efficiency. When the display device adopts an organic layer such as a light-emitting layer, formed of the light-emitting compound, an organic organic electro-luminescence (EL) device displaying blue can be obtained.

13 Claims, 4 Drawing Sheets

LIGHT-EMITTING COMPOUND AND DISPLAY DEVICE ADOPTING LIGHT-EMITTING COMPOUND AS COLOR-DEVELOPING SUBSTANCE

BACKGROUND OF THE INVENTION

1. Field of the Invention

The present invention relates to a blue light-emitting compound and a display device adopting the light-emitting compound as a color-developing substance.

2. Description of the Related Art

Recent advances in the information and communications industries have increased the need for high performance display devices. Generally, display devices are classified into luminous types and non-luminous types. Luminous type display devices include cathode ray tube (CRT) and light emitting diode (LED), and non-luminous type display device include liquid crystal display (LCD).

As an index of the basic performance of the display device, there are operating voltage, power consumption, luminance, contrast, response time, life span and display color, among others.

The LCD, as one of the non-luminous type display device, has been most favored recently, due to its light weight and low power consumption. However, characteristics such as response time, contrast and viewing angle properties are unsatisfactory, leaving room for improvement. Meanwhile, an electro-luminescence (EL) device has been focused as a next generation display device which can solve such problems.

The EL device as a spontaneous luminous type display has a broad viewing angle, a good contrast characteristic and a rapid response time. The EL device is classified into an inorganic EL device and an organic EL device depending on the material used for a light-emitting layer. In particular, the organic EL device has good luminance, driving voltage and response time characteristic and can display a multitude of colors, compared to the inorganic EL device.

Figure 1:
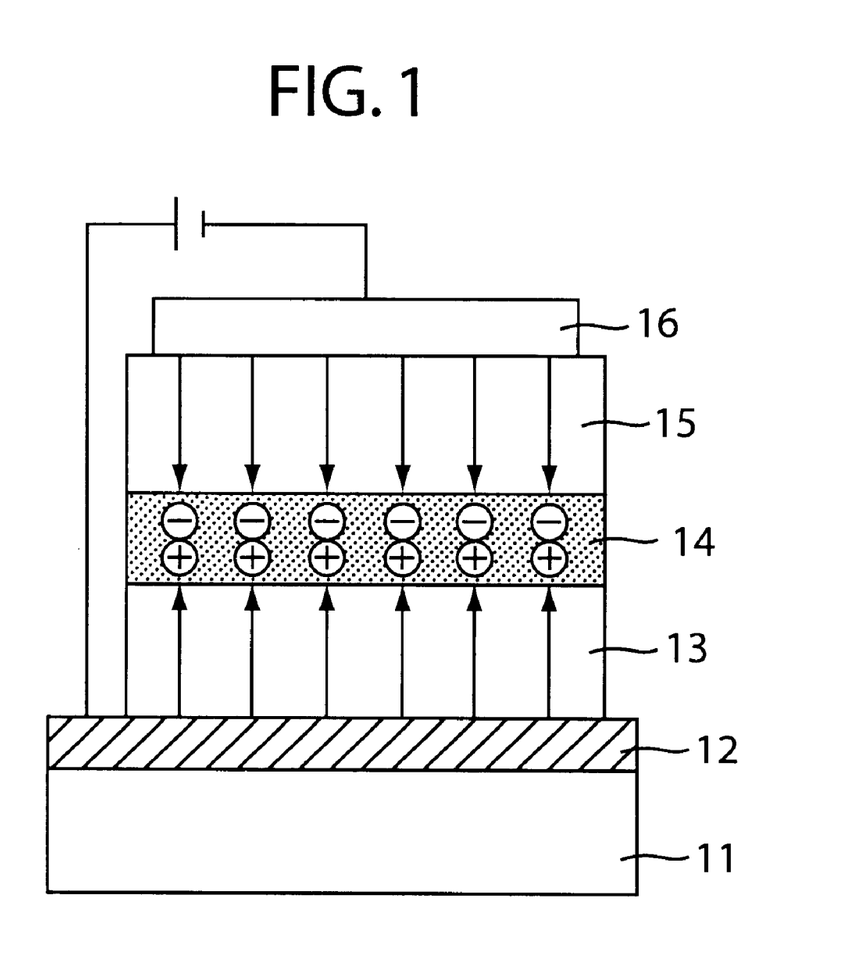
FIG. 1 is a section view showing the structure of a general organic electro-luminacence (EL) device.

FIG. 1 is a section view showing the structure of a general EL device. Referring to FIG. 1, an anode 12 is formed on a substrate 11. A hole transport layer 13, a light-emitting layer 14, an electron transport layer 15, and a cathode 16 are formed on the anode 12 in sequence. Here, the hole transport layer 13, the light-emitting layer 14 and the electron transport layer 15 are organic thin films formed of an organic compound.

The organic EL device having the above structure operates based on the following operation principle. When a voltage is applied between the anode 12 and the cathode 16, holes injected from the anode 12 move through the hole transport layer 13 to the light-emitting layer 14. Meanwhile, electrons are injected from the cathode 16 through the electron transport layer 15 to the light-emitting layer 14. Also, carriers are recoupled in the light-emitting layer 14 to generate excitons. The excitons are transited from an excited state to a ground state, so that fluorescent molecules of the light-emitting layer emit light to form a picture.

Also, an organic EL device adopting an aromatic diamine and aluminum complex having a low molecular weight has been developed by Eastman Kodak Company (*Appl. Phys. Lett.* 51, 913, 1987)

In addition, an organic EL device adopting a polymer such as poly(p-phenylenevinylene) (PPV) or poly(2-methoxy-5-(2'-ethylhexyloxy)-1,4-phenylenevinylene) as a material for a light-emitting layer has been disclosed (*Nature*, 347, 539, 1990, and *Appli. Phys. Lett.* 58, 1982, 1991). However, PPV among the polymers has a poor solubility in an organic solvent, so that it is difficult to adopt a spin-coating so as to form a film by spin-coating method. To solve this problem, a soluble PPV having a functional group capable of improving its solubility in an organic solvent has been developed. The organic EL device having a light-emitting layer formed of PPV or a derivative of the PPV displays a multitude of colors from green to orange.

Also, the well-known blue light-emitting compound is low in luminous efficiency compared to another color of light-emitting compound, thus a need for a new blue light-emitting compound having a high luminous efficiency has increased.

SUMMARY OF THE INVENTION

It is an object of the present invention to provide a blue light-emitting compound having improved luminous efficiency.

It is another object of the present invention to provide a display device adopting the blue light-emitting compound as a color-developing substance.

To achieve the first object of the present invention, there is provided a light-emitting compound represented by the chemical formula (1):

(1)

wherein Ar is independently selected from the group consisting of unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole; $R_1$ and $R_2$ are independently selected from the group consisting of hydrogen, $C_1$–$C_{20}$ alkyl group and $C_1$–$C_{20}$ alkoxy group, and $R_3$ and $R_4$ are independently hydrogen or phenyl group; and n is 0 or 1; M is selected from groups represented by the following structural formulae:

wherein in the structural formulae of M, $R_5$ and $R_6$ are independently selected from the group consisting of hydrogen, $C_1$–$C_{20}$ alkyl group and $C_1$–$C_{20}$ alkoxy group.

The second object of the present invention is achieved by a display device adopting the light-emitting compound as a color-developing substance. Preferably, the display device is an organic electro-luminescence (EL) device adopting the light-emitting compound as a color-developing substance.

To achieve the second object of the present invention, there is provided an organic electro-luminescence device comprising an organic layer between a pair of electrodes, wherein the organic layer comprises a light-emitting compound represented by the chemical formula (1):

(1)

wherein Ar is independently selected from the group consisting of unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole; $R_1$ and $R_2$ are independently selected from the group consisting of hydrogen, $C_1$–$C_{20}$ alkyl group and $C_1$–$C_{20}$ alkoxy group, and $R_3$ and $R_4$ are independently hydrogen or phenyl group; and n is 0 or 1; M is selected from groups represented by the following structural formulae:

wherein in the structural formulae of M, $R_5$ and $R_6$ are independently selected from the group consisting of hydrogen, $C_1$–$C_{20}$ alkyl group and $C_1$–$C_{20}$ alkoxy group.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

A light-emitting compound according to the present invention, represented by the following chemical formula (1), which is a blue luminous material, adopts a bulky group causing steric hindrance at its end, such as triphenylsilylphenyl group, triphenylmethylphenyl group or fluorene group, to prevent packing between molecules. As a result, quenching of exciton by the interaction between the molecules is suppressed, thereby improving luminous efficiency.

(1)

In the chemical formula (1), wherein Ar is independently selected from the group consisting of unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole; $R_1$ and $R_2$ are independently selected from the group consisting of hydrogen, $C_1$–$C_{20}$ alkyl group and $C_1$–$C_{20}$ alkoxy group, and $R_3$ and $R_4$ are independently hydrogen or phenyl group; and n is 0 or 1; M is selected from groups represented by the following structural formulae:

wherein in the structural formulae of M, $R_5$ and $R_6$ are independently selected from the group consisting of hydrogen, $C_1$–$C_{20}$ alkyl group and $C_1$–$C_{20}$ alkoxy group.

In the chemical formula (1), the example of the substituted phenyl includes methoxyphenyl, methylphenyl, triphenylsilylphenyl and ethylhexyloxyphenyl, the example of the substituted naphthalene includes methoxynaphthalene and phenylnaphthalene, the example of the substituted anthracene includes phenylanthracene, the example of the substituted diphenylanthracene includes 2-phenoxy-9,10-diphenylanthracene, the example of the substituted phenanthrene includes phenylphenanthrene, the example of the substituted indene includes dihexylindene, the example of the substituted acenaphthene includes phenylacenaphthene, the example of the substituted biphenyl includes methoxybiphenyl and phenoxybiphenyl, the example of the substituted fluorene includes dimethylfluorene, diethylfluorene, dipropylfluorene, dibutylfluorene, dipentylfluorene, dihexylfluorene, diheptylfluorene, dioctylfluorene, dinonylfluorene, didecylfluorene, didodecylfluorene and diphenyl fluorene, the example of the substituted carbazole includes N-ethylhexylcarbazole, the example of the substituted thiophene includes 5-phenylthiophene, the example of the substituted pyridine includes phenylpyridine, the example of the substituted oxadiazole includes phenyloxadiazole and diphenyloxadiazole, the example of the substituted oxazole includes benzooxazole, the example of the substituted triazole includes 2,5-dipheyl-1-(3'-trifluoromethylphenyl)triazole, the example of the substituted benzothiophene includes phenylbenzothiophene, the example of the substituted dibenzofuran includes phenyldibenzofuran, and the example of the substituted thiadiazole includes phenylthiadiazole and diphenylthiadiazole.

The compound of the formula (1) can be used as a color-developing material for a display device. In particular, the light-emitting compound is very useful in forming an organic layer such as a light-emitting layer of an organic electro-luminescence (EL) device.

For example, the compound represented by the chemical formula (1) according to the present invention may be compounds represented by chemical formulae (2) through (4).

(2)

(3)

(4)

The compound represented by the formula (2) is the compound when Ar is a phenyl group, $R_1$ is 2-ethylhexyloxy group, $R_2$ is a methoxy group, $R_3$ and $R_4$ are both hydrogen, M is triphenylsilylphenyl group, and n is 1 in the formula (1). The compound represented by the formula (3) is the compound when Ar is 1,3,4-oxadiazol, $R_1$, $R_2$, $R_3$ and $R_4$ are all hydrogen, M is a triphenylsilylphenyl group, and n is 1 in the formula (1). The compound represented by the formula (4) is the compound when Ar is a biphenyl group, $R_1$ and $R_2$ are both hydrogen, $R_3$ and $R_4$ are all phenyl group, M is 9,9'-dihexyl fluorene, and n is 0 in the formula (1).

Hereinafter, a method for manufacturing an organic EL device according to the present invention will be described.

First, a material for an anode is coated on a substrate. Here, the substrate is a substrate used for a general organic EL device, preferably, a glass substrate or a transparent plastic substrate which is good in transparency, surface flatness, convenience in handling and waterproofing characteristic. Also, indium tin oxide (ITO), tin oxide ($SnO_2$) or zinc oxide (ZnO), which is excellent in transparency and conductivity, is used as a material for the anode.

A composition for a hole transport layer is deposited on the anode in a vacuum to form a hole transport layer, and then the compound of the formula (1) is deposited on the hole transport layer in a vacuum, to form a light-emitting layer.

Then, a metal for forming a cathode is deposited in a vacuum or is sputtered on the light-emitting layer, to form a cathode, thereby completing an organic EL device. Here, the material for the cathode may be lithium (Li), magnesium (Mg), aluminum (Al), an Al—Li alloy, calcium (Ca), a magnesium-indium (Mg—In) alloy or a magnesium-silver (Mg—Ag) alloy.

Here, an electron transport layer may be formed before the cathode is formed on the light-emitting layer. The electron transport layer is formed of a conventional material for forming an electron transport layer.

The material for the hole transport layer is not limited to a specific material. Preferably, the material for the hole transport layer is triphenylamine derivative such as N,N'-bis(3-methylphenyl)-N,N'-diphenyl-[1,1'-biphenyl]-4,4'-diamine (TPD)

The organic EL device according to the present invention may further comprise an intermediate layer for improving characteristics of the device, between two layers selected from the anode, the hole transport layer, the light-emitting layer, the electron transport layer and the cathode. For example, a buffer layer may be formed between the anode and the hole transport layer. Such buffer layer decreases contact resistance between the anode and the hole transport layer, and simultaneously improves the transport ability of holes from the anode to the light-emitting layer, thereby improving overall characteristics of the device.

A material for the buffer layer is not limited to a specific material. However, preferably, the material for the buffer layer is polyethylene dioxythiophene (PEDT) or polyaniline.

The organic EL device is formed by stacking in sequence the anode, the hole transport layer, the light-emitting layer, the electron transport layer and the cathode as above. Alternatively, the order of stacking the respective layers may be reversed such that the cathode, the electron transport layer, the light-emitting layer, the hole transport layer and the anode are stacked in sequence.

Figure 2:
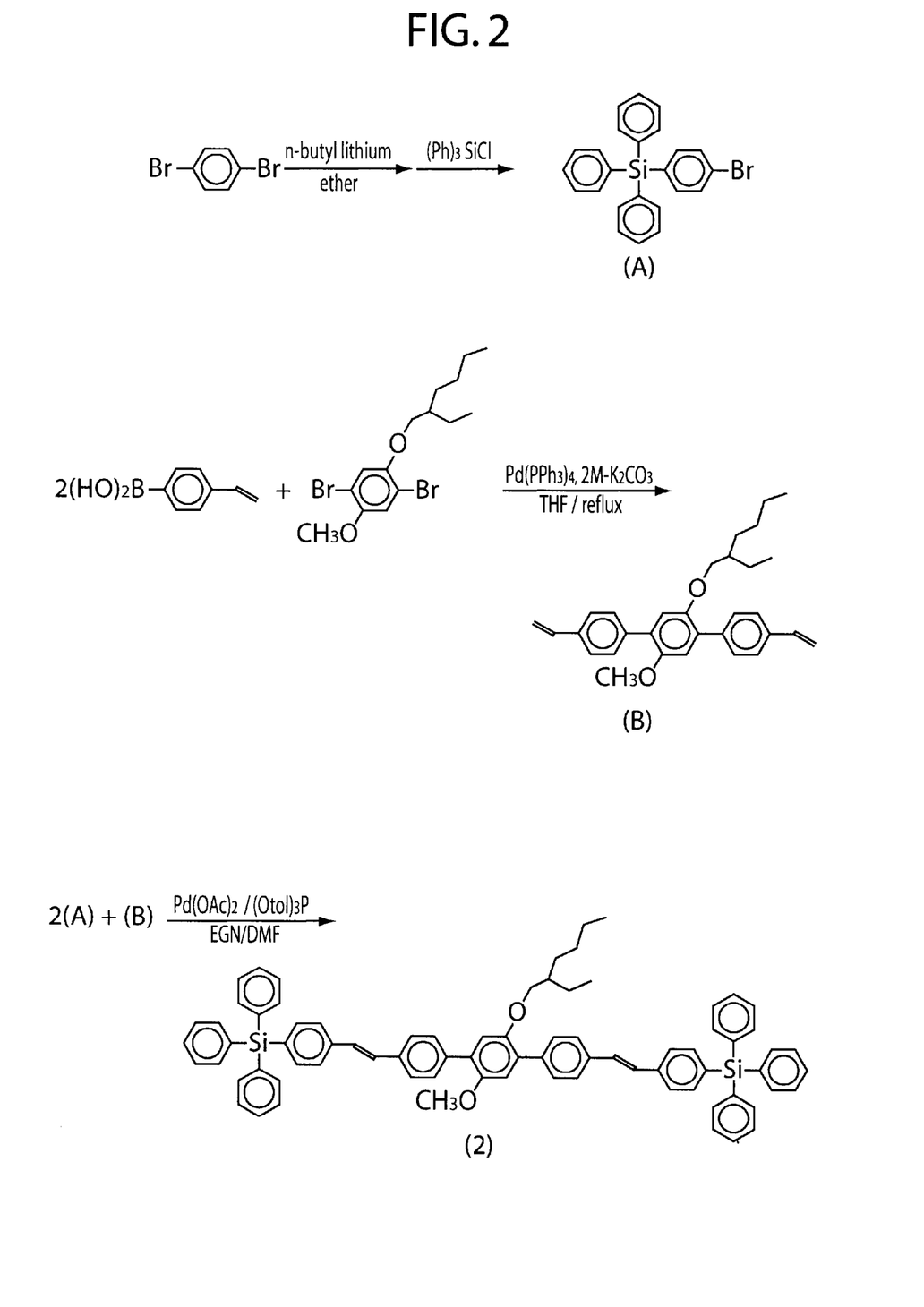
FIGS. 2 through 4 illustrate the process of synthesizing the compounds represented by chemical formulae (2) through (4).
Figure 3:
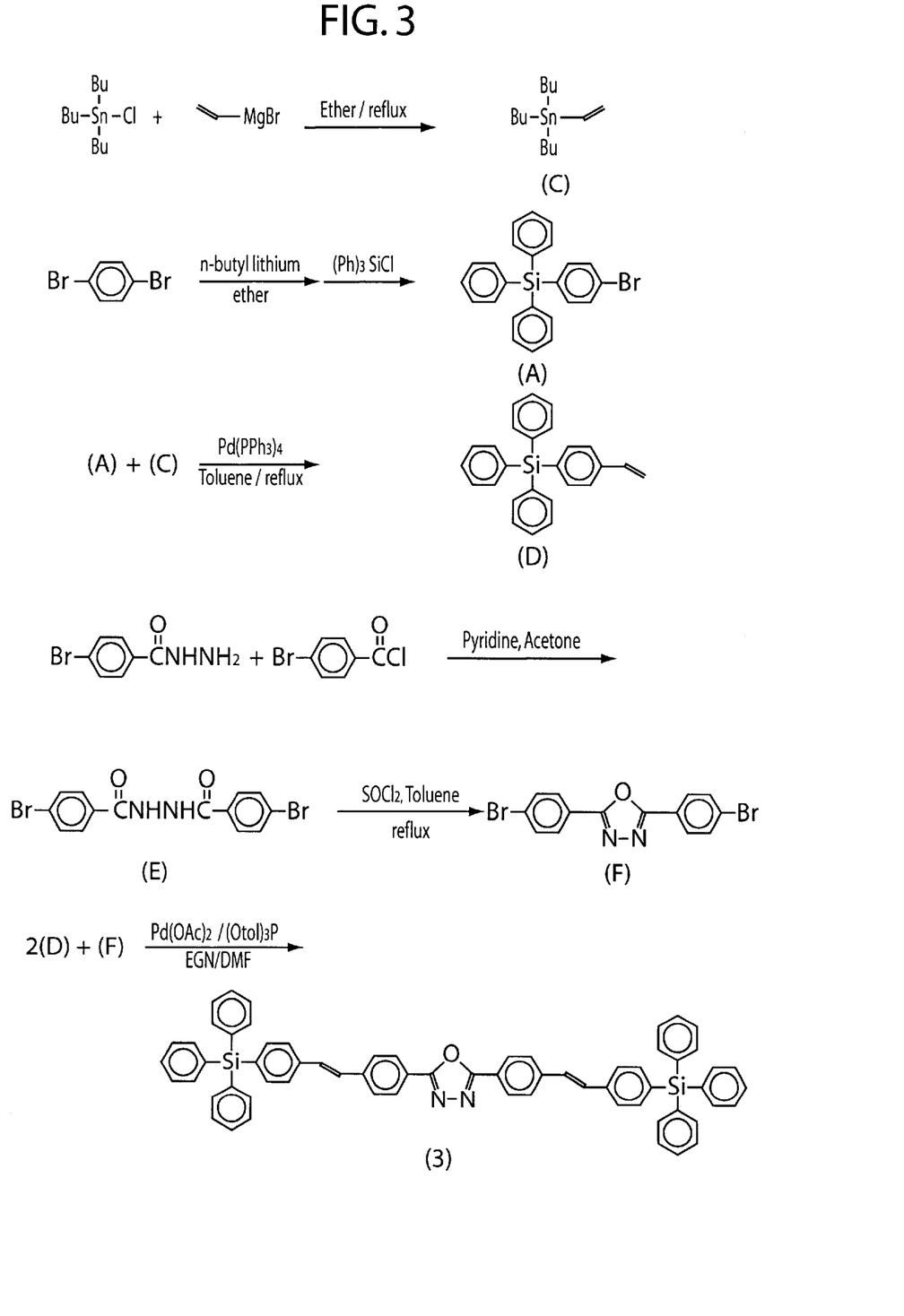
Figure 4:
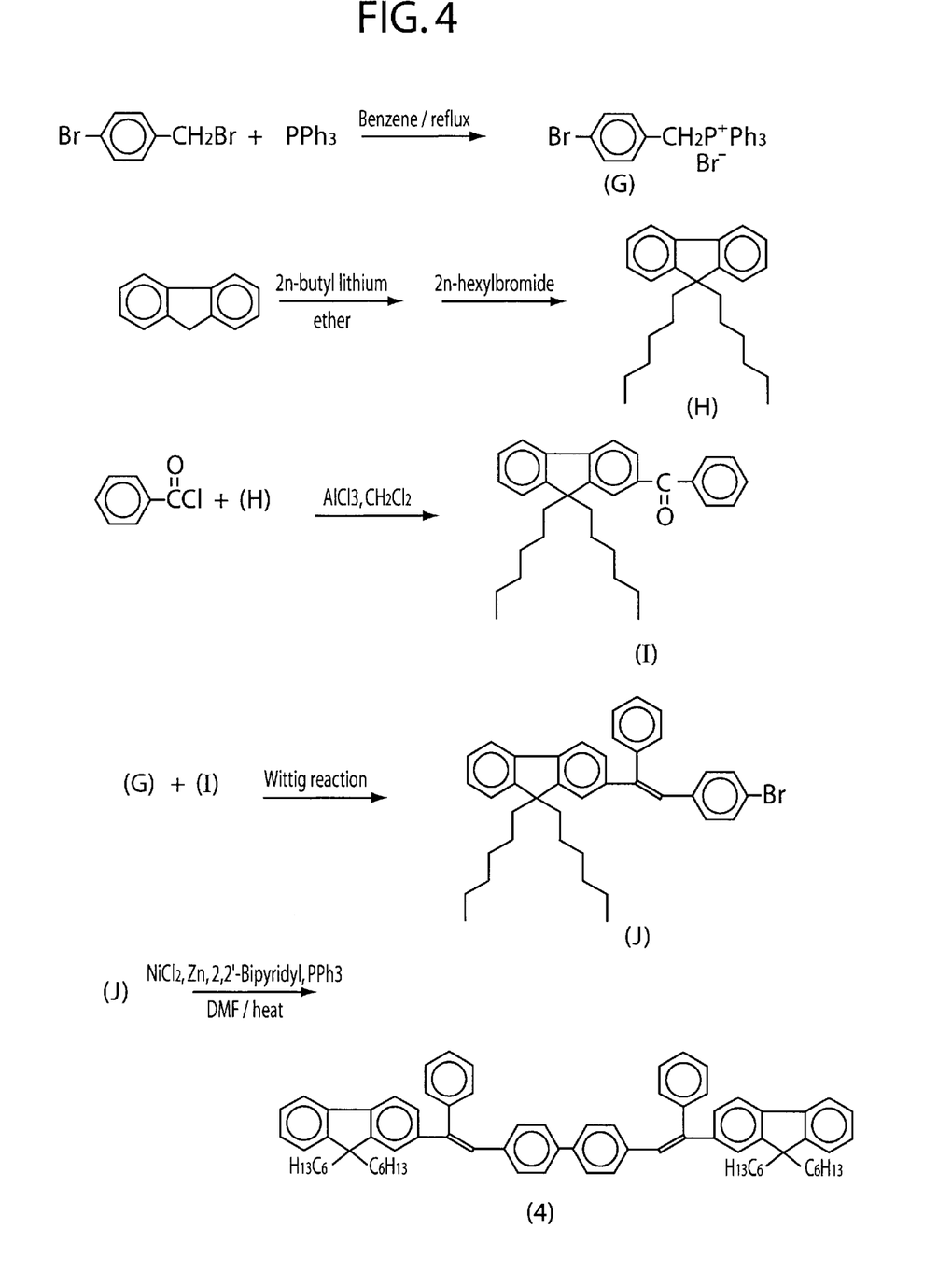

FIGS. 2 through 4 illustrate the process of synthesizing the compounds represented by the formulae (2) through (4). Hereinafter, the present invention will be described in detail through the following examples with reference to FIGS. 2 through 4. However, the present invention is not limited to the following examples.

Synthesis Example 1

Compound of the Formula (2) (see, FIG. 2)

1,4-dibromobenzene was dissolved in diethylether, and then the temperature of the reaction mixture was cooled down to −40° C. Then, n-butyl lithium was slowly added to the mixture, and stirred at room temperature for 2 hours. The temperature of the reaction mixture was adjusted to −78° C., and 1 equiv. of triphenylchlorosilane was added drop-wise into the mixture. Then, the resulting mixture was stirred at room temperature for 12 hours, resulting in triphenylsilylphenyl bromide (A) (yield: 78%).

2-(2'-ethylhexyloxy)-5-methoxy-1,4-dibromobenzene and 4-vinylphenylboronic acid were mixed in a mole ratio of 1:2, and tetrahydrofuran (THF), 2M potassium carbonate ($K_2CO_3$) aqueous solution and tetrakis (triphenylphosphine) palladium were added to the mixture and then mixed. Then, the mixture was reacted for 24 hours, resulting in a compound (B) (yield: 60%).

The compounds (A) and (B) were dissolved in N,N-dimethyl formamide (DMF), and then palladium (II) diacetate (($CH_3CO_2)_2Pd$), ($CH_3C_6H_4O)_3P$ and trimethylamine were added to the mixture and then mixed. The reaction mixture was heated to 100° C. for 40 hours. After the reaction was completed, the resulting mixture was poured in methanol for precipitation. The resulting precipitate was dissolved in chloroform, and methanol was then added into the solution for re-precipitation. The resulting precipitate was filtered and dried, to attain the compound of the formula (2) (yield: 56%).

Synthesis Example 2

Compound of the Formula (3) (see, FIG. 3)

Vinylmagnesium bromide was put in a round-bottomed flask, and tri-n-butyl tin chloride and THF were added drop-wise into the flask under nitrogen gas atmosphere. The reaction mixture was refluxed for 24 hours, resulting in a compound (C) (yield: 80%).

1,4-dibromobenzene was dissolved in diethylether, and then the temperature of the reaction mixture was adjusted to −40° C. Then, n-butyl lithium was added drop-wise into the solution, and stirred at room temperature for 2 hours. The temperature of the reaction mixture was adjusted to −78° C., and 1 equiv. of triphenylchlorosilane was added drop-wise into the mixture. Then, the resulting mixture was stirred at room temperature for 12 hours, resulting in a compound (A) (yield: 80%).

Anhydrous toluene, the compound (A), a small amount of 2,6-di-tert-butyl-4-methylphenol (BHT) and tetrakis(triphenylphosphine)palladium were mixed and stirred, and then the compound (C) was added to the mixture. The resulting reaction mixture was refluxed for 24 hours, resulting in a compound (D) (yield: 80%).

Pyridine and 4-bromobenzoic hydrazide were dissolved in anhydrous acetone. Then, 4-bromobenzoyl chloride dissolved in acetone was added to the solution, and then refluxed for 6 hours, resulting in a compound (E) (yield: 70%).

Thionyl chloride and toluene were added to the compound (E) and then refluxed for 24 hours, resulting in 2,5-bis(4'-bromophenyl)-1,3,4-oxadiazole (compound (F)) (yield: 95%).

DMF, the compunds (D) and (F), palladium (II) diacetate ($(CH_3CO_2)_2Pd$), $(CH_3C_6H_4O)_3P$ and triethylamine were mixed and then heated to 100° C. Then, the resulting mixture was reacted at the same temperature for 40 hours.

After the reaction was completed, the reaction mixture was poured in methanol for precipitation. The resulting precipitate was dissolved in chloroforme, and then methanol was added to the solution for re-precipitation. The resulting precipitate was filtered and dried to attain the compound of the formula (3) (yield: 48%).

Synthesis Example 3

Compound of the Formula (4) (see, FIG. 3)

Triphenylphosphine and benzene were added to 4-bromobenzyl bromide, and then the mixture was refluxed for 12 hours, resulting in 4-bromobenzyltriphenylphosphonium bromide (G) (yield: 95%).

Fluorene was dissolved in diethylether, and then 2 equiv. of n-butyl lithium was added to the mixture. Then, 2 equiv. of n-hexyl bromide was added to the mixturere, resulting in 9,9'-dihexyl fluorene (H))(yield: 95%).

Methylene chloride, 9,9'-dihexyl fluorene (H) and aluminum chloride were added to benzoyl chloride, and the mixture was reacted, resulting in a compound (I). The compound (I) was mixed with 4-bromobenzyltriphenylphosphonium bromide (G) for the Wittig reaction, resulting in a compound (J) (yield: 60%).

Anhydrous nickel (II) chloride ($NiCl_2$), 2,2'-bipyridine, triphenyl phosphine and zinc (Zn) powder were put in a 3-neck round-bottomed flask. The flask was purged with argon (Ar) gas about ten times. Anhydrous DMF was added to the reaction mixture, and the temperature of the reaction mixture was adjusted to 50° C. The compound (J) was rapidly added to the reaction mixture under nitrogen gas atmosphere, and the temperature of the mixture was adjusted to 90° C. The reaction mixture was stirred for 24 hours, resulting in the compound represented by the formula (4) (yield: 90%).

Example 1

After forming an electrode of ITO on a glass substrate, N,N'-bis(3-methylphenyl)-N,N'-diphenyl-[1,1'-biphenyl]-4,4'-diamine (TPD) was deposited on the ITO electrode in a vacuum, to form a hole transport layer having a thickness of 400 Å. Then, the compound of the formula (2) was deposited on the hole transport layer in a vacuum, to form a light-emitting layer having a thickness of 600 Å.

Then, Al and Li were simultaneously deposited on the light-emitting layer in a vacuum, to form an Al—Li electrode having a thickness of 1,200 Å, resulting in an organic EL device.

Example 2

An organic EL device was manufactured by the same method as in Example 1, except that the compound of the formula (3) was used instead of the compound of the formula (2) to form a light-emitting layer.

Example 3

An organic EL device was manufactured by the same method as in Example 1, except that the compound of the formula (4) was used instead of the compound of the formula (2) to form a light-emitting layer.

Example 4

After forming an electrode of ITO on a glass substrate, TPD was deposited on the ITO electrode in a vacuum, to form a hole transport layer having a thickness of 400 Å. Then, the compound of the formula (3) was deposited on the hole transport layer in a vacuum, to form a light-emitting layer having a thickness of 600 Å.

Then, tris(8-quinolinol)aluminum (Alq) represented by the following formula (5) was deposited on the light-emitting layer in a vacuum, to form an electron transport layer having a thickness of 400 Å.

(5)

Then, Al and Li were simultaneously deposited on the electron transport layer in a vacuum, to form an Al—Li electrode having a thickness of 1,200 Å, resulting in an organic EL device.

Turn-on voltage, luminance and color characteristics of the organic EL devices manufactured in Examples 1 through 4 were measured, and the results are tabulated in Table 1.

TABLE 1

| classification | turn-on voltage (V) | luminance (cd/m$^2$) | color (EL λ max) |
|---|---|---|---|
| Example 1 | 3 | 20,000 | blue (460 nm) |
| Example 2 | 3 | 20,000 | blue (460 nm) |

TABLE 1-continued

| classification | turn-on voltage (V) | luminance (cd/m²) | color (EL λ max) |
| --- | --- | --- | --- |
| Example 3 | 3 | 20,000 | blue (450 nm) |
| Example 4 | 3 | 25,000 | blue (460 nm) |

As can be understood from Table 1, the organic EL devices manufactured in Examples 1 through 4 have very low turn-on voltage of 3V and good luminance characteristics. This is because mobility of holes or electrons in the light-emitting layer increases due to a hole transporting group or an electron transporting group contained in the compounds represented by the chemical formulae (2) through (4) used for forming the light-emitting layer in Examples (1) through (4).

The light-emitting compound of the formula (1) according to the present invention, as a blue luminous material, provides good luminous efficiency, so that it is useful as a color-developing material for a display.

Also, the organic EL device according to the present invention adopts an organic layer such as a light-emitting layer, formed of the compound of the formula (1), so that it can display blue.

What is claimed is:

1. A light-emitting compound represented by the chemical formula (1):

(1)

wherein Ar is independently selected from the group consisting of unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole; $R_1$ and $R_2$ are independently selected from the group consisting of hydrogen, $C_1$–$C_{20}$ alkyl group and $C_1$–$C_{20}$ alkoxy group, and $R_3$ and $R_4$ are independently hydrogen or phenyl group; and n is 0 or 1; M is selected from groups represented by the following structural formulae:

wherein in the structural formulae of M, $R_5$ and $R_6$ are independently selected from the group consisting of hydrogen, $C_1$–$C_{20}$ alkyl group and $C_1$–$C_{20}$ alkoxy group.

2. The light-emitting compound of claim 1, wherein Ar is phenyl group, $R_1$ is 2-ethylhexyloxy group, $R_2$ is methoxy group, $R_3$ and $R_4$ are both hydrogen, M is triphenylsilylphenyl group, and n is 1.

3. The light-emitting compound of claim 1, wherein Ar is 1,3,4-oxadiazole, $R_1$, $R_2$, $R_3$ and $R_4$ are all hydrogen, M is triphenylsilylphenyl group, and n is 1.

4. The light-emitting compound of claim 1, wherein Ar is biphenyl group, $R_1$ and $R_2$ are both hydrogen, $R_3$ and $R_4$ are all phenyl group, M is 9,9'-dihexyl fluorene, and n is 0.

5. An organic electro-luminescence device comprising an organic layer between a pair of electrodes, wherein the organic layer comprises a light-emitting compound represented by the chemical formula (1):

(1)

wherein Ar is independently selected from the group consisting of unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole; $R_1$ and $R_2$ are independently selected from the group consisting of hydrogen, $C_1$–$C_{20}$ alkyl group and $C_1$–$C_{20}$ alkoxy group, and $R_3$ and $R_4$ are independently hydrogen or phenyl group; and n is 0 or 1; M is selected from groups represented by the following structural formulae:

wherein in the structural formulae of M, $R_5$ and $R_6$ are independently selected from the group consisting of hydrogen, $C_1$–$C_{20}$ alkyl group and $C_1$–$C_{20}$ alkoxy group.

6. The organic electro-luminescence device of claim 5, wherein Ar is phenyl group, $R_1$ is 2-ethylhexyloxy group, $R_2$ is methoxy group, $R_3$ and $R_4$ are both hydrogen, M is triphenylsilylphenyl group, and n is 1.

7. The organic electro-luminescence device of claim 5, wherein Ar is 1,3,4-oxadiazole, $R_1$, $R_2$, $R_3$ and $R_4$ are all hydrogen, M is triphenylsilylphenyl group, and n is 1.

8. The organic electro-luminescence device of claim 5, wherein Ar is biphenyl group, $R_1$ and $R_2$ are-both hydrogen, $R_3$ and $R_4$ are all phenyl group, M is 9,9'-dihexyl fluorene, and n is 0.

9. The organic electro-luminescence device of claim 5, wherein the organic layer is a light-emitting layer.

10. A display device adopting the light-emitting compound claimed in claim 1 as a color-developing substance.

11. A display device adopting the light-emitting compound claimed in claim 2 as a color-developing substance.

12. A display device adopting the light-emitting compound claimed in claim 3 as a color-developing substance.

13. A display device adopting the light-emitting compound claimed in claim 4 as a color-developing substance.

* * * * *